US012727194B2

(12) United States Patent
Steinmann et al.

(10) Patent No.: US 12,727,194 B2
(45) Date of Patent: Sep. 1, 2026

(54) SEMICONDUCTOR DIE HAVING A DRIFT REGION WITH A CHARGE COMPENSATION REGION FORMED THEREIN WHERE THE CHARGE COMPENSATION REGION HAS A PLURALITY OF GUARD RINGS FORMED IN A FIRST AND A SECOND OPPOSITE DOPING TYPE PORTIONS

(71) Applicant: Wolfspeed, Inc., Durham, NC (US)

(72) Inventors: Philipp Steinmann, Durham, NC (US); Edward Robert Van Brunt, Raleigh, NC (US); Sei-Hyung Ryu, Cary, NC (US); Jae-Hyung Park, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 671 days.

(21) Appl. No.: 16/806,489

(22) Filed: Mar. 2, 2020

(65) Prior Publication Data

US 2021/0273090 A1 Sep. 2, 2021

(51) Int. Cl.
*H10D 30/66* (2025.01)
*H10D 62/10* (2025.01)

(52) U.S. Cl.
CPC ......... *H10D 30/665* (2025.01); *H10D 62/106* (2025.01); *H10D 62/111* (2025.01)

(58) Field of Classification Search
CPC ............. H01L 29/0634; H01L 29/0619; H01L 29/7811
See application file for complete search history.

(56) References Cited

U.S. PATENT DOCUMENTS 5,075,739 A * 12/1991 Davies ................ H01L 29/0619 257/E29.013
7,026,650 B2 * 4/2006 Ryu .................... H01L 29/0619 257/77

(Continued)

FOREIGN PATENT DOCUMENTS

EP 3012870 A1 * 4/2016 ......... H01L 29/0615
JP 2018148000 A 9/2018
WO 2016102549 A1 6/2016

OTHER PUBLICATIONS

Kinoshita, Kozo, et al., "Guard Ring Assisted Resurf: A New Termination Structure Providing Stable and High Breakdown Voltage for SiC Power Devices," Symposium on Power Semiconductor Devices & ICS, Jun. 2002, Santa Fe, New Mexico, IEEE, pp. 253-256.

(Continued)

*Primary Examiner* — Anh D Mai
(74) *Attorney, Agent, or Firm* — Myers Bigel, P.A.

(57) ABSTRACT

A semiconductor die includes a drift region, an active region in the drift region, and an edge termination region surrounding the active region in the drift region. The drift region has a first doping type. The edge termination region includes a charge compensation region, a number of guard rings, and a counter doping region. The charge compensation region is in the drift region and has a second doping type that is opposite the first doping type. The guard rings are in the charge compensation region, have the second doping type, and a doping concentration that is greater than a doping concentration of the charge compensation region. The counter doping region is in the drift region and overlaps at least a portion of the charge compensation region. The counter doping region has the first doping type.

14 Claims, 8 Drawing Sheets

(56) References Cited

U.S. PATENT DOCUMENTS

| | | | |
|---|---|---|---|
| 9,412,807 | B1 | 8/2016 | Huang et al. |
| 9,515,135 | B2 | 12/2016 | Ryu et al. |

OTHER PUBLICATIONS

International Search Report and Written Opinion for International Patent Application No. PCT/US2021/020350, mailed May 26, 2021, 18 pages.

* cited by examiner

SEMICONDUCTOR DIE HAVING A DRIFT REGION WITH A CHARGE COMPENSATION REGION FORMED THEREIN WHERE THE CHARGE COMPENSATION REGION HAS A PLURALITY OF GUARD RINGS FORMED IN A FIRST AND A SECOND OPPOSITE DOPING TYPE PORTIONS

FIELD OF THE DISCLOSURE

The present disclosure is related to semiconductor die, and in particular to power semiconductor die including improved edge termination.

BACKGROUND

Semiconductor devices are formed in an active region of a semiconductor die. In semiconductor die manufactured to support high voltages and currents, concentration of electric fields can interfere with the proper operation thereof. Concentration of electric fields is especially problematic at edges of the semiconductor die. Accordingly, in such die an edge termination region surrounds the active region about a perimeter of the semiconductor die to reduce electric fields at the edges of the die. Without an edge termination region, electric fields would concentrate at the edges of the die and cause the performance of the die to suffer. For example, the breakdown voltage, leakage current, and/or reliability of the die may be significantly reduced. Specifically, the die may suffer from leakage current under reverse bias when subject to thermal stress (e.g., temperatures greater than 150° C.). While several edge termination structures have been proposed for reducing the concentration of electric fields at the edges of a die, many of the proposed structures are unable to reduce the concentration of electric fields to a desired level. Accordingly, there is a need for improved edge termination structures for semiconductor devices and methods for manufacturing the same.

SUMMARY

In one embodiment, a semiconductor die includes a drift region, an active region in the drift region, and an edge termination region surrounding the active region in the drift region. The drift region has a first doping type. The edge termination region includes a charge compensation region, a number of guard rings, and a counter doping region. The charge compensation region is in the drift region and has a second doping type that is opposite the first doping type. The guard rings are in the charge compensation region, have the second doping type, and a doping concentration that is greater than a doping concentration of the charge compensation region. The counter doping region is in the drift region and overlaps at least a portion of the charge compensation region. The counter doping region has the first doping type. By providing the counter doping region, an electric field concentration in the edge termination region can be reduced and the performance of the semiconductor die, for example, breakdown voltage and leakage current drift, can be improved.

In one embodiment, a semiconductor die includes an active region and an edge termination region surrounding the active region. The active region includes one or more semiconductor devices. The edge termination region is provided so that the one or more semiconductor devices are configured to provide a shift in leakage current less than 400

$$\frac{\text{pA}}{hr \cdot \text{cm}^2}$$

at a rated voltage of the semiconductor die under constant bias and thermal stress.

In one embodiment, the one or more semiconductor devices have a leakage current less than 1

$$\frac{\mu A}{\text{cm}^2}$$

at the rated voltage of the semiconductor die under constant bias and thermal stress. The rated voltage of the semiconductor die may be greater than 600 V.

In one embodiment, a method for manufacturing a semiconductor die includes providing a drift region, providing an active region in the drift region, and providing an edge termination region surrounding the active region in the drift region. The drift region is provided having a first doping type. Providing the edge termination region comprises providing a charge compensation region in the drift region, providing a number of guard rings in the charge compensation region, and providing a counter doping region in the drift region and overlapping at least a portion of the charge compensation region. The charge compensation region has a second doping type that is opposite the first doping type. The guard rings have the second doping type and a doping concentration that is greater than a doping concentration of the charge compensation region. The counter doping region has the first doping type. By providing the counter doping region, an electric field concentration in the edge termination region can be reduced and the performance of the semiconductor die, for example, breakdown voltage and leakage current drift, can be improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
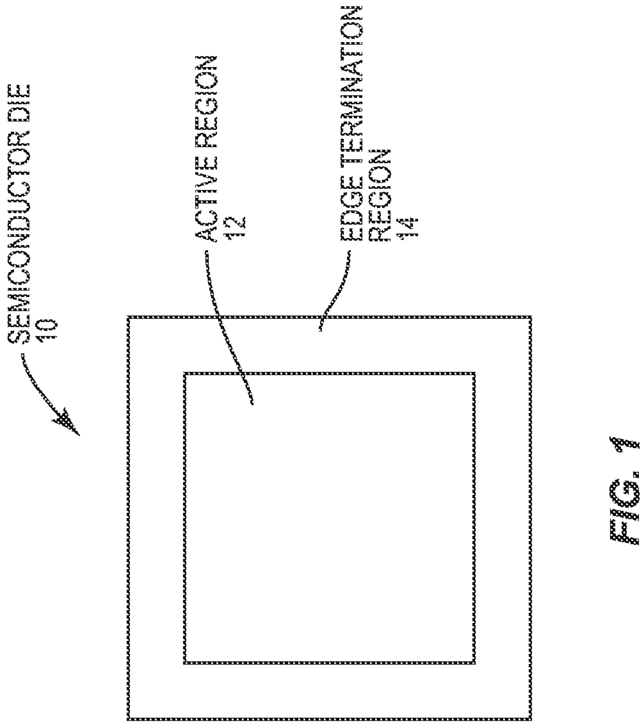
FIG. 1 is a top-down view of a semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a top view of a semiconductor die 10 according to one embodiment of the present disclosure. The semiconductor die 10 includes an active region 12 and an edge termination region 14 surrounding the active region 12 about a perimeter of the semiconductor die 10. As discussed below, the active region 12 includes one or more semiconductor devices formed therein, such as one or more metal-oxide-semiconductor field-effect transistors (MOSFETs), diodes, Schottky diodes, JBS diodes, or the like. The edge termination region 14 reduces a concentration of an electric field at the edges of the semiconductor die 10 in order to improve the performance thereof. For example, the edge termination region 14 may increase a breakdown voltage of the semiconductor die 10, may decrease a leakage current of the semiconductor die 10 over time, and the like as discussed in detail below.

Figure 2:
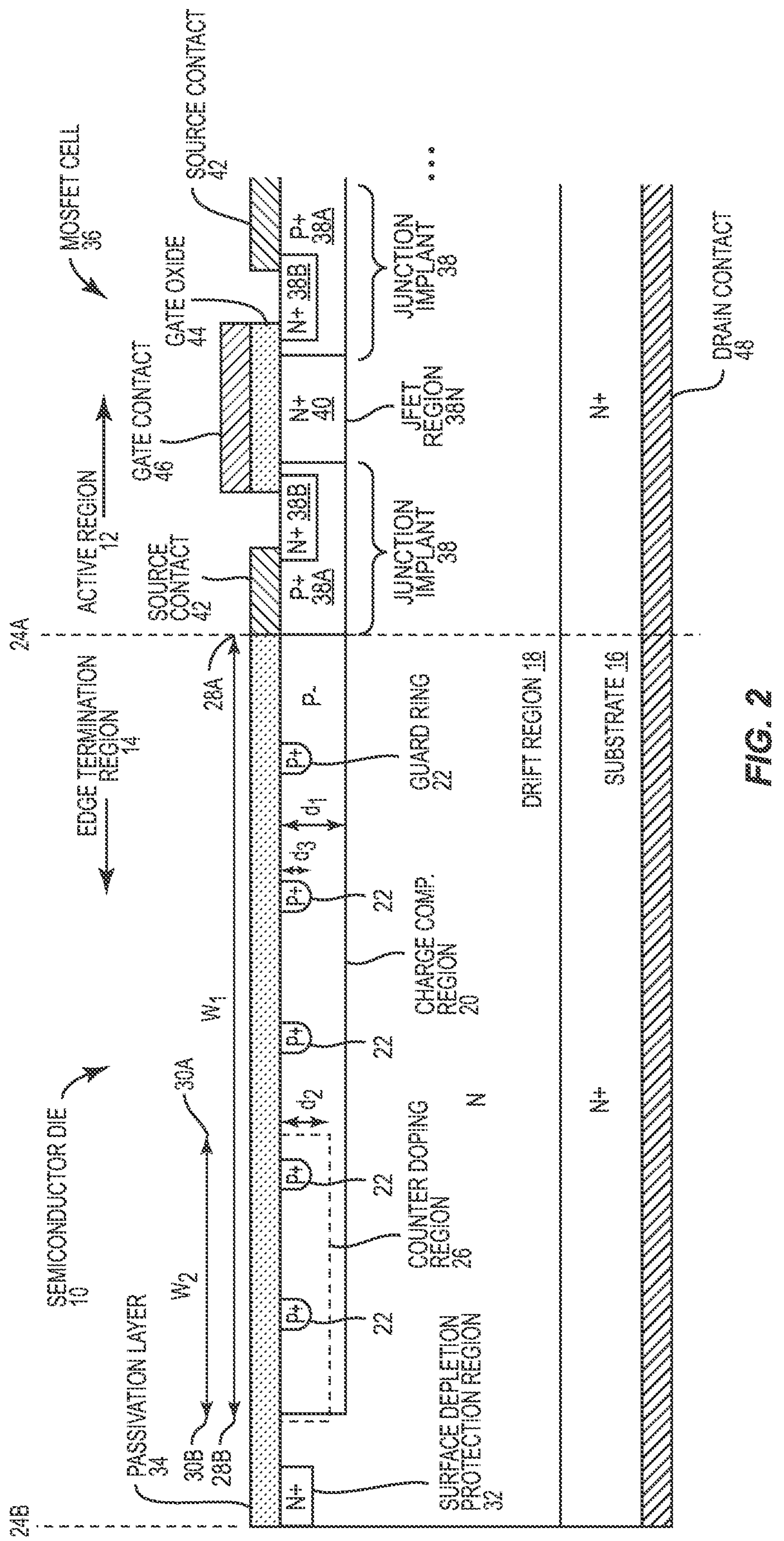
FIG. 2 is a cross-sectional view of a portion of a semiconductor die according to one embodiment of the present disclosure.
Figure 3:
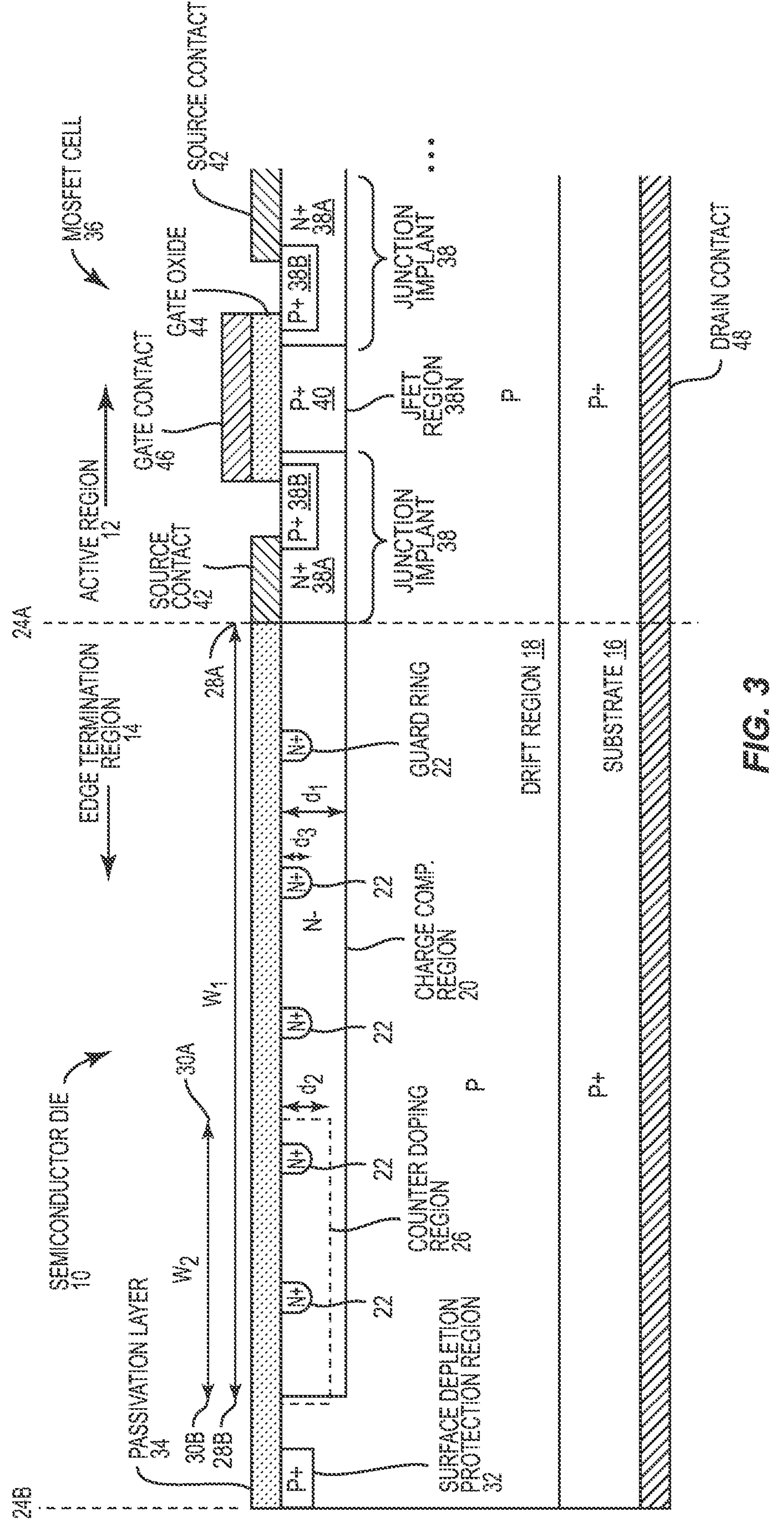
FIG. 3 is a cross-sectional view of a portion of a semiconductor die according to one embodiment of the present disclosure.

FIG. 2 illustrates a cross-sectional view of a portion of the semiconductor die 10 according to one embodiment of the present disclosure. The semiconductor die 10 includes a substrate 16 and a drift region 18 on the substrate 16. In the edge termination region 14, a charge compensation region 20 is provided in the drift region 18. Specifically, the charge compensation region 20 is provided adjacent a surface of the drift region 18 opposite the substrate 16. A number of guard rings 22 are also provided in the drift region 18. Specifically, the guard rings 22 are provided adjacent the surface of the drift region 18 opposite the substrate 16. The charge compensation region 20 has a doping type that is opposite a doping type of the drift region 18. The guard rings 22 have the same doping type as the charge compensation region 20 and have a higher doping concentration than that of the charge compensation region 20. In the present example, the drift region 18 is an n-type layer while the charge compensation region 20 and the guard rings 22 are p-type regions. However, the principles of the present disclosure apply equally to devices having the opposite doping types as illustrated in FIG. 2 Such an embodiment is illustrated in FIG. 3, which is substantially the same as FIG. 2 except that the doping types are reversed.

With just the charge compensation region 20 and the guard rings 22 in the edge termination region 14, a doping concentration of the charge compensation region 20 must be chosen carefully to minimize electric field concentration at both an inside edge 24A and an outside edge 24B of the edge termination region 14. Unfortunately, electric field concentration at the inside edge 24A is inversely proportional to the doping concentration of the charge compensation region 20 and electric field concentration at the outside edge 24B is proportional to the doping concentration of the charge compensation region 20. Accordingly, the doping concentration of the charge compensation region 20 in this scenario must be chosen to balance electric field concentration at the inside edge 24A and the outside edge 24B such that neither can be fully optimized.

With the above in mind, a counter doping region 26 is provided to reduce a doping concentration within the charge compensation region 20 in the area over which it is provided, and may enable an optimal reduction in electric field concentration both at the inside edge 24A and the outside edge 24B of the edge termination region 14. The counter doping region 26 has a doping type that is opposite that of the charge compensation region 20. In the present example wherein the charge compensation region 20 is a p-type region, the counter doping region 26 is thus an n-type region. However, as discussed above, the principles of the present disclosure apply equally to devices having the opposite doping types as illustrated in FIG. 2.

Figure 4:
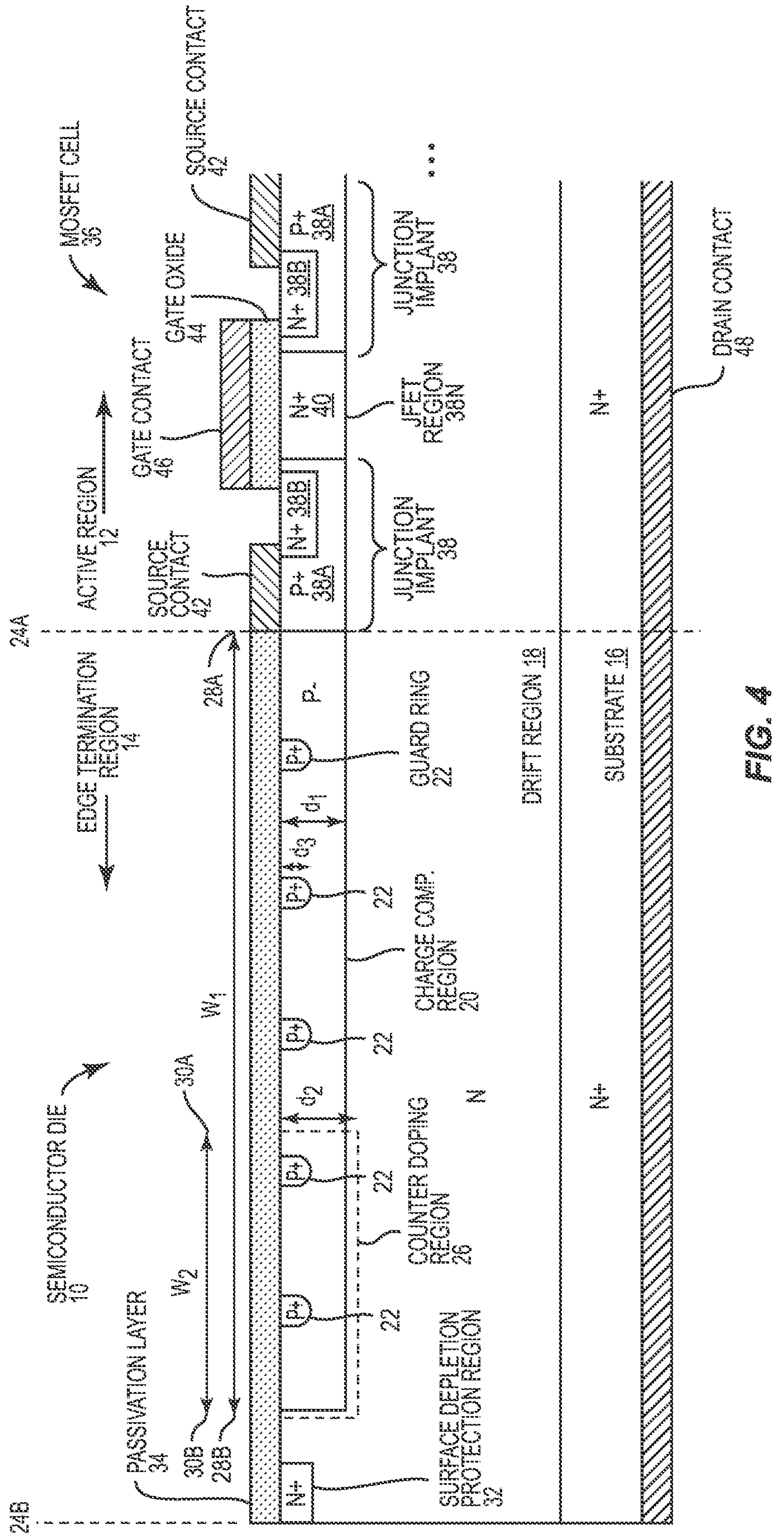
FIG. 4 is a cross-sectional view of a portion of a semiconductor die according to one embodiment of the present disclosure.
Figure 5:
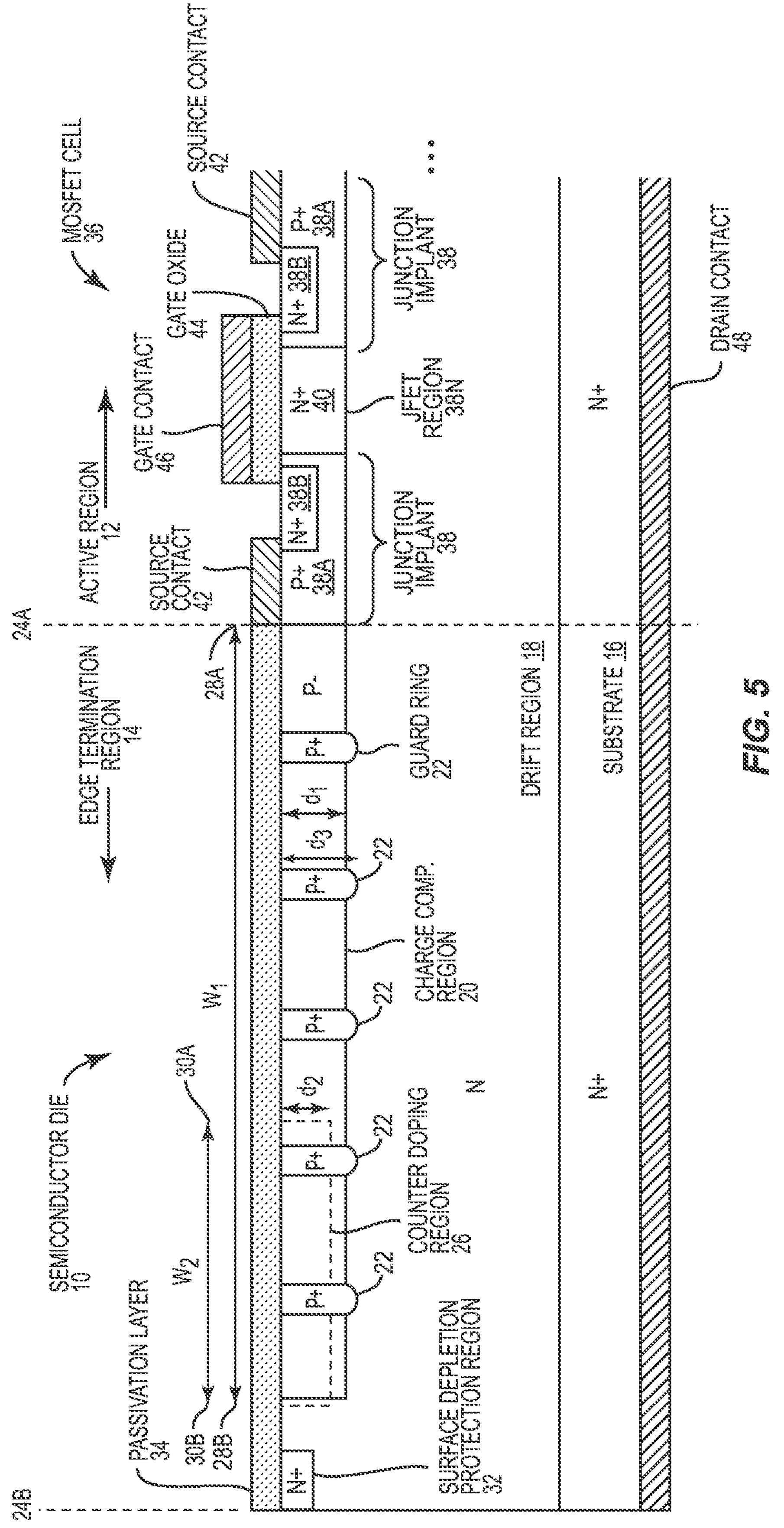
FIG. 5 is a cross-sectional view of a portion of a semiconductor die according to one embodiment of the present disclosure.
Figure 6:
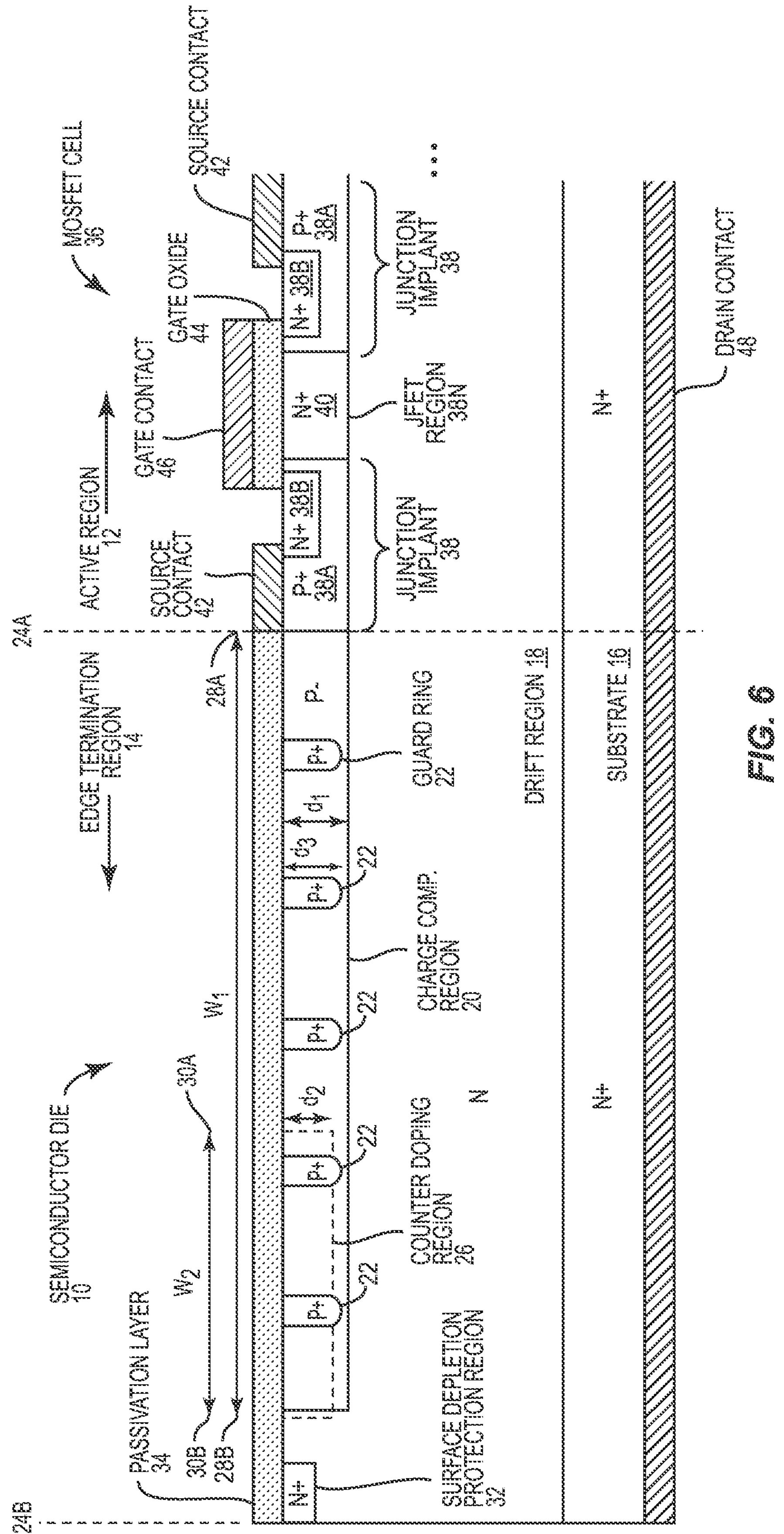
FIG. 6 is a cross-sectional view of a portion of a semiconductor die according to one embodiment of the present disclosure.

The charge compensation region 20 is provided to a first depth $d_1$ from the surface of the drift region 18 opposite the substrate 16. The counter doping region 26 is provided to a second depth $d_2$ from the surface of the drift region 18 opposite the substrate 16. In one embodiment, the second depth $d_2$ is less than the first depth $d_1$ such that the charge compensation region 20 extends below the counter doping region 26 and the counter doping region 26 is within the charge compensation region 20. In other embodiments, however, the second depth $d_2$ may be greater than the first depth $d_1$ such that the counter doping region 26 extends below the charge compensation region 20. Such an embodiment is illustrated in FIG. 4, which is substantially the same as FIG. 2 except that the second depth $d_2$ is greater than the first depth $d_1$. The guard rings 22 are provided to a third depth $d_3$ from the surface of the drift region 18 opposite the substrate 16. In one embodiment, the third depth $d_3$ is less than the first depth $d_1$ such that the guard rings 22 are within the charge compensation region 20. However, in other embodiments the third depth $d_3$ may be greater than the first depth $d_1$ such that the guard rings 22 extend below the charge compensation region 20. Such an embodiment is illustrated in FIG. 5, which is substantially similar to FIG. 2 except that the third depth $d_3$ is greater than the first depth $d_1$. Similarly, the third depth $d_3$ may be less than the second depth $d_2$ such that one or more of the guard rings 22 are within the counter doping region 26. However, in other embodiments the third depth $d_3$ may be greater than the second depth $d_2$ such that one or more of the guard rings 22 extend below the counter doping region 26. That is, the third depth $d_3$ may be less than both the first depth $d_1$ and the second depth $d_2$, greater than the second depth $d_2$ but less than the third depth $d_3$, or greater than both the second depth $d_2$ and the third depth $d_3$. FIG. 6 illustrates the embodiment wherein the first depth $d_1$ is greater than the second depth $d_2$ and less than the third depth $d_3$. As shown, the guard rings 22 are laterally separated from one another by a portion of the charge compensation region 20. The first depth $d_1$ may be between 0.1 μm and 2.5 μm. In various embodiments, the first depth $d_1$ may be any subrange between 0.1 μm and 2.5 μm. For example, the first depth $d_1$ may be between 0.1 μm and 2.0 μm, between 0.1 μm and 1.5 μm, between 0.1 μm and 1.0 μm, between 0.1 μm and 0.5 μm, between 0.5 μm and 2.5 μm, between 1.0 μm and 2.5 μm, between 1.5 μm and 2.5 μm, between 2.0 μm and 2.5 μm, between 0.5 μm and 1.0 μm, between 0.5 μm and 1.5 μm, between 0.5 μm and 2.0 μm, between 1.0 μm and 1.5 μm, between 1.0 μm and 2.0 μm, between 1.0 μm and 2.5 μm, between 1.5 μm and 2.0 μm, between 1.5 μm and 2.0 μm, and between 2.0 μm and 2.5 μm. The second depth $d_2$ may be between 0.1 μm and 2 μm. In various embodiments, the second depth $d_2$ may be any subrange between 0.1 μm and 2.0 μm. For example, the second depth $d_2$ may be between 0.1 μm and 1.5 μm, between 0.1 μm and 1.0 μm, between 0.1 μm and 0.5 μm, between 0.5 μm and 2.0 μm, between 0.5 μm and 1.5 μm, between 0.5 μm and 1.0 μm, between 1.0 μm and 1.5 μm, between 1.0 μm and 2.0 μm, and between 1.5 μm and 2.0 μm. Further, the second depth $d_2$ may be less than $d_1$. The third depth $d_3$ may be between 0.1 μm and 3 μm. In various embodiments, the third depth $d_3$ may be any subrange between 0.1 μm and 3.0 μm. For example, the third depth $d_3$ may be between 0.1 μm and 2.5 μm, between 0.1 μm and 2.0 μm, between 0.1 μm an 1.5 μm, between 0.1 μm and 1.0 μm, between 0.1 μm and 0.5 μm, between 0.5 μm and 3.0 μm, between 0.5 μm and 2.5 μm, between 0.5 μm and 2.0 μm, between 0.5 μm and 1.5 μm, between 0.5 μm and 1.0 μm, between 1.0 μm and 3.0 μm, between 1.0 μm and 2.5 μm, between 1.0 μm and 2.0 μm, between 1.0 μm and 1.5 μm, between 1.5 μm and 3.0 μm, between 1.5 μm and 2.5 μm, between 1.5 μm and 2.0 μm, between 2.0 μm and 3.0 μm, between 2.0 μm and 2.5 μm, and between 2.5 μm and 3.0 μm.

The charge compensation region 20 may be provided over a first width $w_1$ between an inside edge 28A and an outside edge 28B while the counter doping region 26 may be provided over a second width $w_2$ between an inside edge 30A and an outside edge 30B. The second width $w_2$ may be between 1% and 200% of the first width $w_1$ such that the counter doping region 26 extends over only a portion of the charge compensation region 20, over the entirety of the charge compensation region 20, or over the entirety of the charge compensation region 20 and into the active region 12. As discussed above, the inside edge 30A of the counter doping region 26 may overlap the inside edge 28A of the charge compensation region 20 such that the counter doping region 26 extends into the active region 12. Similarly, the outside edge 30B of the counter doping region 26 may overlap the outside edge 28B of the charge compensation region 20. In other embodiments, the inside edge 28A and the outside edge 28B of the charge compensation region 20 may overlap the inside edge 30A and the outside edge 30B of the counter doping region 26 such that the second width $w_2$ is contained within the first width $w_1$.

In some embodiments, a surface depletion protection region 32 may also be provided in the drift region 18 at the outside edge of the edge termination region 14. The surface depletion protection region 32 has the same doping type as the drift region 18 but a higher doping concentration than that of the drift region 18. The surface depletion protection region 32 may prevent depletion at the surface of the drift region 18 in order to further improve the performance of the semiconductor die 10. A passivation layer 34 may be provided on the surface of the drift region 18 opposite the substrate 16. The passivation layer 34 passivates the surface of the drift region 18 and may comprise any suitable material for doing so, such as an oxide.

The substrate 16 may have a doping concentration between $1\times10^{17}$ cm$^{-3}$ and $1\times10^{20}$ cm$^{-3}$. In various embodiments, the doping concentration of the substrate 16 may be provided at any subrange between $1\times10^{17}$ cm$^{-3}$ and $1\times10^{20}$ cm$^{-3}$. For example, the doping concentration of the substrate 16 may be between $1\times10^{18}$ cm$^{-3}$ and $1\times10^{20}$ cm$^{-3}$, between $1\times10^{19}$ cm$^{-3}$ and $1\times10^{20}$ cm$^{-3}$, between $1\times10^{17}$ cm$^{-3}$ and $1\times10^{19}$ cm$^{-3}$, between $1\times10^{17}$ cm$^{-3}$ and $1\times10^{18}$ cm$^{-3}$, and between $1\times10^{18}$ cm$^{-3}$ and $1\times10^{19}$ cm$^{-3}$. The drift region 18 may have a doping concentration between $1\times10^{14}$ cm$^{-3}$ and $1\times10^{18}$ cm$^{-3}$. In various embodiments, the doping concentration of the drift region 18 may be provided at any subrange between $1\times10^{14}$ cm$^{-3}$ and $1\times10^{18}$ cm$^{-3}$. For example, the doping concentration of the drift region 18 may be between $1\times10^{15}$ cm$^{-3}$ and $1\times10^{18}$ cm$^{-3}$, between $1\times10^{16}$ cm$^{-3}$ and $1\times10^{18}$ cm$^{-3}$, between $1\times10^{17}$ cm$^{-3}$ and $1\times10^{18}$ $cm^{-3}$, between $1\times10^{14}$ $cm^{-3}$ and $1\times10^{17}$ $cm^{-3}$, between $1\times10^{14}$ $cm^{-3}$ and $1\times10^{16}$ $cm^{-3}$, between $1\times10^{14}$ $cm^{-3}$ and $1\times10^{15}$ $cm^{-3}$, between $1\times10^{15}$ $cm^{-3}$ and $1\times10^{17}$ $cm^{-3}$, between $1\times10^{15}$ $cm^{-3}$ and $1\times10^{16}$ $cm^{-3}$, and between $1\times10^{16}$ $cm^{-3}$ and $1\times10^{17}$ $cm^{-3}$. The charge compensation region 20 may have a doping concentration between $1\times10^{16}$ $cm^{-3}$ and $5\times10^{18}$ $cm^{-3}$. In various embodiments, the doping concentration of the charge compensation region 20 may be provided at any subrange between $1\times10^{16}$ $cm^{-3}$ and $5\times10^{18}$ $cm^{-3}$. For example, the doping concentration of the charge compensation region 20 may be between $1\times10^{17}$ $cm^{-3}$ and $5\times10^{18}$ $cm^{-3}$ and between $1\times10^{16}$ $cm^{-3}$ and $5\times10^{17}$ $cm^{-3}$. The guard rings 22 may have a doping concentration between $5\times10^{18}$ $cm^{-3}$ and $1\times10^{21}$ $cm^{-3}$. In various embodiments, the doping concentration of the guard rings 22 may be provided at any subrange between $5\times10^{18}$ $cm^{-3}$ and $1\times10^{21}$ $cm^{-3}$. For example, the doping concentration of the guard rings 22 may be between $5\times10^{19}$ $cm^{-3}$ and $1\times10^{21}$ $cm^{-3}$, between $5\times10^{20}$ $cm^{-3}$ and $1\times10^{21}$ $cm^{-3}$, between $5\times10^{18}$ $cm^{-3}$ and $1\times10^{20}$ $cm^{-3}$, between $5\times10^{18}$ $cm^{-3}$ and $1\times10^{19}$ $cm^{-3}$, and between $5\times10^{19}$ $cm^{-3}$ and $1\times10^{20}$ $cm^{-3}$. The counter doping region 26 may have a doping concentration between $1\times10^{16}$ and $5\times10^{18}$ $cm^{-3}$. In various embodiments, the doping concentration of the counter doping region 26 may be provided at any subrange between $1\times10^{16}$ and $5\times10^{18}$ $cm^{-3}$. For example, the doping concentration of the counter doping region 26 may be between $1\times10^{17}$ $cm^{-3}$ and $5\times10^{18}$ $cm^{-3}$ and between $1\times10^{16}$ $cm^{-3}$ and $5\times10^{17}$ $cm^{-3}$. The doping concentration of any one of the substrate 16, the drift region 18, the charge compensation region 20, the guard rings 22, and the counter doping region 26 above may be provided in any combination of the above ranges given for each element. In some embodiments, a doping concentration of the counter doping region 26 may vary across the width of the region between the inside edge 30A and the outside edge 30B thereof. For example, a doping concentration of the counter doping region 26 may be highest at the outside edge 30B thereof and decrease in proportion to a distance from the outside edge 30B. The doping concentration may vary across an entirety of width of the counter doping region 26 or over a subset of the width of the counter doping region 26 such that a remainder of the width of the counter doping region 26 is provided having a constant doping concentration. The doping concentration may vary in any fashion such as a linear fashion, a stepwise fashion, an exponential fashion, or the like. Such a doping profile may be achieved, for example, using an implantation mask having a varying depth profile, or by any other suitable process such as by varying the implantation energy during an implantation process.

As discussed above, the active region 12 includes one or more semiconductor devices. In the present example, the active region 12 includes at least one metal-oxide-semiconductor field-effect transistor (MOSFET) cell 36. The MOSFET cell 36 includes the substrate 16 and the drift region 18. A number of junction implants 38 are provided in the drift region 18, and specifically in a surface of the drift region 18 opposite the substrate 16. The junction implants 38 include a first well region 38A having a doping type that is opposite that of the drift region 18 and a second well region 38B having a doping type that is the same as the drift region 18. The junction implants 38 are separated from one another by a JFET region 40. The JFET region 40 has the same doping type as that of the drift region 18 and a higher doping concentration than that of the drift region 18. A source contact 42 is provided over each one of the junction implants 38 on the surface of the drift region 18 opposite the substrate 16 such that the source contact 42 contacts a portion of the first well region 38A and the second well region 38B. A gate oxide layer 44 is provided on the surface of the drift region 18 opposite the substrate 16 over the JFET region 40 and a portion of each one of the junction implants 38 such that the gate oxide layer 44 partially overlaps each one of the second well regions 28B. A gate contact 46 is provided on the gate oxide layer 44. A drain contact 48 is provided on a surface of the substrate 16 opposite the drift region 18. The MOSFET cell 36 may be tiled across the active region 12 or tiled in a desired pattern with one or more other semiconductor devices (e.g., diodes) to provide a desired functionality.

Figure 7:
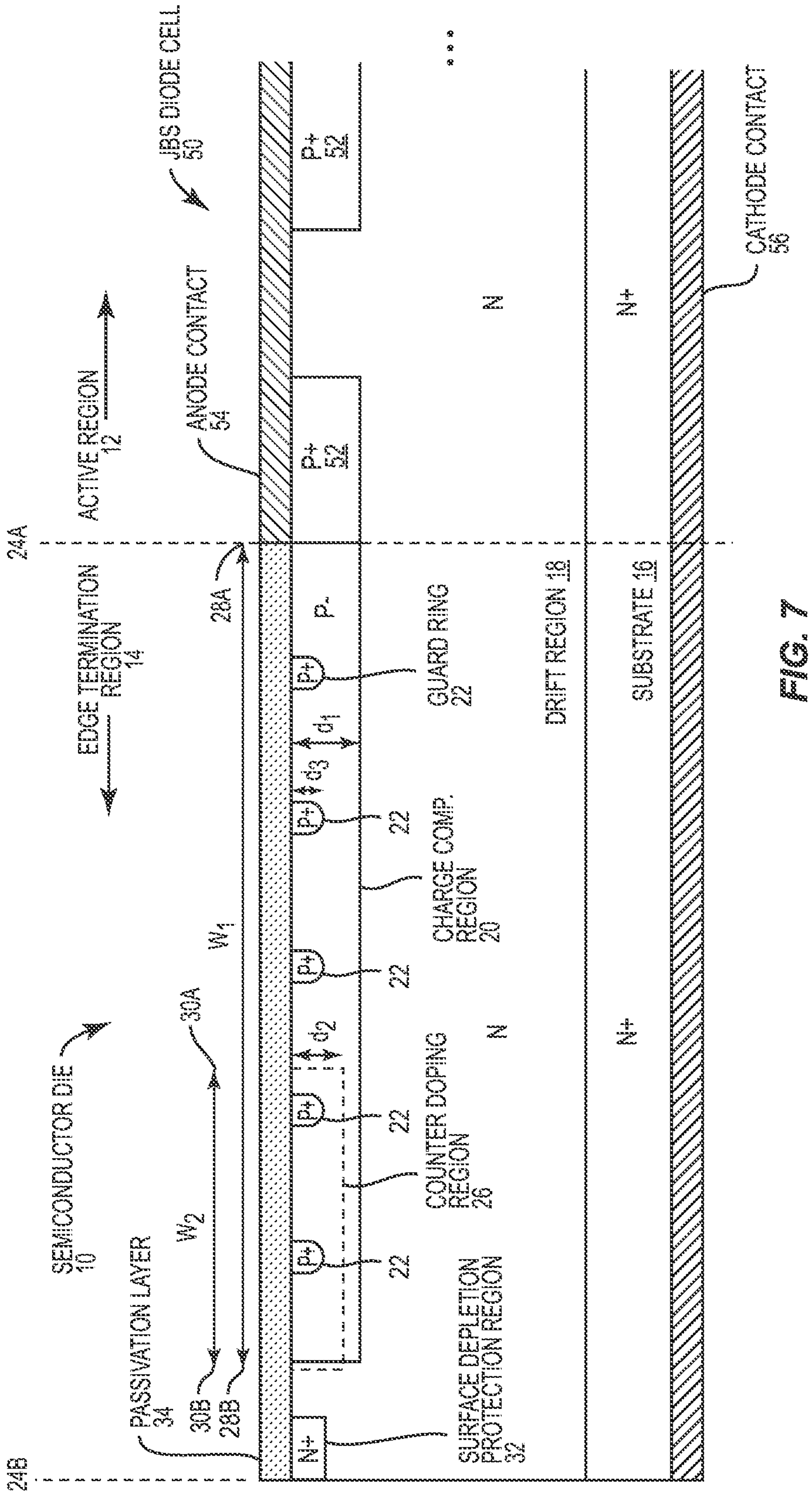
FIG. 7 is a cross-sectional view of a portion of a semiconductor die according to one embodiment of the present disclosure.

FIG. 7 illustrates a cross-sectional view of a portion of the semiconductor die 10 according to an additional embodiment of the present disclosure. The semiconductor die 10 shown in FIG. 7 is substantially similar to that shown in FIG. 2, except that the MOSFET cell 36 is replaced with a junction barrier Schottky (JBS) diode cell 50. The JBS diode cell 50 includes the substrate 16 and the drift region 18. A number of junction barrier implants 52 are provided in the drift region 18, and specifically in a surface of the drift region 18 opposite the substrate 16. The junction barrier implants 52 are separated from each other by a portion of the drift region 18. In some embodiments, the JBS diode cell 50 may include a JFET region (not shown) as an area of increased carrier concentration having the same doping type as the drift region 18 between the junction barrier implants 52. An anode contact 54 is on the surface of the drift region 18 opposite the substrate 16. A cathode contact 56 is on a surface of the substrate 16 opposite the drift region 18. The JBS diode cell 50 may be tiled across the active region 12 or tiled in a desired pattern with one or more other semiconductor devices (e.g., MOSFETs) to provide a desired functionality.

Figure 8:
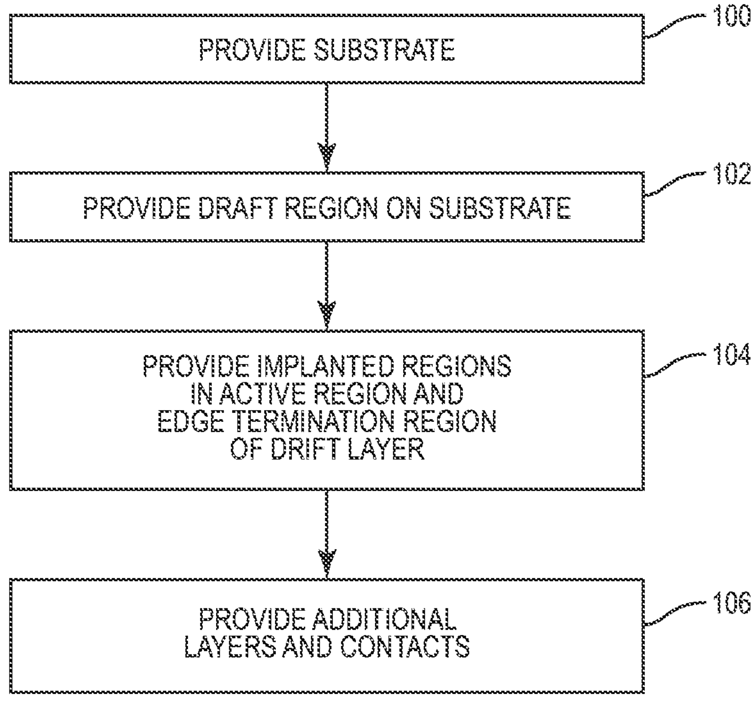
FIG. 8 is a flow diagram illustrating a method for manufacturing a semiconductor die according to one embodiment of the present disclosure.

FIG. 8 is a flow diagram illustrating a method for manufacturing the semiconductor die 10 including the edge termination region 14 according to one embodiment of the present disclosure. First, the substrate 16 is provided (block 100). The drift region 18 is provided on the substrate 16 (block 102). One or more implanted regions are provided in the active region 12 and the edge termination region 14 to form the basis for one or more semiconductor devices in the active region 12 (e.g., the junction implants 38, the JFET region 40, the junction barrier regions 52) as well as the charge compensation region 20, the guard rings 22, and the counter doping region 26 in the edge termination region 14 (block 104). Notably, one or more of the charge compensation region 20, the guard rings 22, and the counter doping region 26 may be provided in a concurrent implanting step as one or more regions that form a semiconductor device in the active region 12 such that one or more of these features can be provided without an additional masking and implantation step. For example, the counter doping region 26 may be provided concurrently with the JFET region 40 such that the counter doping region 26 and the JFET region 40 are provided using the same mask (additional patterning is necessary to provide an opening for implantation of the counter doping region 26). As another example, the charge compensation region 20 and/or the guard rings 22 may be provided concurrently with the junction implants 38 and/or the junction barrier regions 52 such that the charge compensation region 20 and/or the guard rings 22 are provided using the same mask (additional patterning is necessary to provide an opening for implantation of the charge compensation region 20 and/or the guard rings 22). One or more additional layers and contacts are provided (block 106). For example, the passivation layer 34, the source contacts 42, the gate oxide layer 44, the gate contact 46, the drain contact 48, the anode contact 54, and the cathode contact 56 are provided to form one or more semiconductor devices in the active region 12 and complete the fabrication of the semiconductor die 10. Those skilled in the art will recognize that additional manufacturing steps may be necessary to provide a complete semiconductor die 10, all of which are contemplated herein. The foregoing steps are merely meant to provide an example of the basic steps necessary to provide the features of the edge termination region 14 discussed above and at least one semiconductor device in the active region 12.

Providing the edge termination region 14 as discussed herein may provide several performance benefits. For example, providing the edge termination region 14 as discussed herein may increase a breakdown voltage of the semiconductor die 10. Further, providing the edge termination region 14 as discussed herein may significantly decrease a change in leakage current of the semiconductor die 10 over time at a rated voltage thereof under constant bias. In a blocking state of the semiconductor die 10 in which a voltage is supported across the substrate 16 and drift region 18 of the semiconductor die 10 by one or more switching devices (e.g., by one or more MOSFET cells 36 and/or one or more JBS diode cells 50), a leakage current of the semiconductor die 10 may change less than 400

$$\frac{\text{pA}}{hr \cdot \text{cm}^2},$$

less than 350

$$\frac{\text{pA}}{hr \cdot \text{cm}^2},$$

less than 300

$$\frac{\text{pA}}{hr \cdot \text{cm}^2},$$

less than 250

$$\frac{\text{pA}}{hr \cdot \text{cm}^2},$$

less than 200

$$\frac{\text{pA}}{hr \cdot \text{cm}^2},$$

less than 150

$$\frac{\text{pA}}{hr \cdot \text{cm}^2},$$

less than 100

$$\frac{\text{pA}}{hr \cdot \text{cm}^2},$$

less than 50

$$\frac{\text{pA}}{hr \cdot \text{cm}^2},$$

and less than 10

$$\frac{\text{pA}}{hr \cdot \text{cm}^2}$$

and as low as 1

$$\frac{\text{pA}}{\text{hr} \cdot \text{cm}^2}$$

at a rated voltage of the semiconductor die 10 under reverse bias (blocking) conditions in various embodiments. The leakage current of the semiconductor die 10 may be less than the values discussed above under thermal stress. As discussed herein, thermal stress may occur at temperatures greater than 150° C., temperatures greater than 170° C., temperatures greater than 200° C., greater than 800° C., and temperatures up to 2500° C. In various embodiments, the leakage current of the semiconductor die 10 may be less than the values discussed above under constant reverse bias conditions and thermal stress. Any range in the values above is contemplated herein, such as a change in leakage current between 1-400

$$\frac{\text{pA}}{\text{hr} \cdot \text{cm}^2},$$

between 50-400

$$\frac{\text{pA}}{\text{hr} \cdot \text{cm}^2},$$

between 100-400

$$\frac{\text{pA}}{\text{hr} \cdot \text{cm}^2},$$

between 150-400

$$\frac{\text{pA}}{\text{hr} \cdot \text{cm}^2},$$

between 200-400

$$\frac{\text{pA}}{\text{hr} \cdot \text{cm}^2},$$

between 250-400

$$\frac{pA}{hr \cdot cm^2},$$

between 300-400

$$\frac{pA}{hr \cdot cm^2},$$

between 350-400

$$\frac{pA}{hr \cdot cm^2},$$

between 100-400

$$\frac{pA}{hr \cdot cm^2},$$

between 100-350

$$\frac{pA}{hr \cdot cm^2},$$

between 100-300

$$\frac{pA}{hr \cdot cm^2},$$

between 100-250

$$\frac{pA}{hr \cdot cm^2},$$

between 100-200

$$\frac{pA}{hr \cdot cm^2},$$

between 100-150

$$\frac{pA}{hr \cdot cm^2},$$

between 200-400

$$\frac{pA}{hr \cdot cm^2},$$

between 200-350

$$\frac{pA}{hr \cdot cm^2},$$

between 200-300

$$\frac{pA}{hr \cdot cm^2},$$

between 200-250

$$\frac{pA}{hr \cdot cm^2},$$

between 200-400

$$\frac{pA}{hr \cdot cm^2},$$

between 250-300

$$\frac{pA}{hr \cdot cm^2},$$

between 250-300

$$\frac{pA}{hr \cdot cm^2},$$

between 300-400

$$\frac{pA}{hr \cdot cm^2},$$

and between 300-350

$$\frac{pA}{hr \cdot cm^2},$$

or any other combination herein. In any of these embodiments, a leakage current of the semiconductor die 10 may have a leakage current less than 1

$$\frac{\mu A}{cm^2}$$

and as low as 1

$$\frac{aA}{cm^2}.$$

A rated voltage of the device may be greater than 600 V, greater than 800 V, greater than 1 kV, greater than 1.2 kV, and up to 20 kV in any of these embodiments.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:

an active region comprising one or more semiconductor devices, the active region comprising a drift region having a first doping type; and an edge termination region surrounding the active region, the edge termination region comprising a charge compensation region having a first portion that has a second doping type that is opposite the first doping type and a second portion that has the first doping type, and a plurality of guard rings having the second doping type, wherein at least one guard ring is positioned in each of the first and second portions of the charge compensation region, wherein the second portion of the charge compensation region has the first doping concentration of second doping type dopants and is counter-doped to have the first doping type.

2. The semiconductor die of claim 1 wherein the edge termination region and the one or more semiconductor devices are configured to limit the leakage current less than 1

$$\frac{\mu A}{\text{cm}^2}$$

at the rated voltage.

3. The semiconductor device of claim 1, wherein the edge termination region and the one or more semiconductor devices are configured to limit a change of a leakage current less than 400

$$\frac{pA}{\text{hr} \cdot \text{cm}^2}$$

under a constant reverse bias and thermal stress, at a rated voltage between 600V and 20 kV.

4. The semiconductor die of claim 1 wherein the entirety of the second portion of the charge compensation region is doped with both first doping type dopants and second doping type dopants.

5. The semiconductor die of claim 1 wherein:

the first portion of the charge compensation region is provided to a first depth in the drift region; and the second portion of the charge compensation region is provided to a second depth in the drift region that is less than the first depth.

6. A semiconductor die comprising:

a drift region having a first doping type;

an active region in the drift region; and an edge termination region surrounding the active region in the drift region, the edge termination region comprising:

a charge compensation region in the drift region, the charge compensation region having a first portion that has a second doping type that is opposite the first doping type and a first doping concentration and a second portion that has the first doping type; and a plurality of guard rings in the charge compensation region, the plurality of guard rings having the second doping type and a second doping concentration that is greater than the first doping concentration, wherein at least a first of the guard rings is within the first portion of the charge compensation region and at least a second of the guard rings is within the second portion of the charge compensation region, wherein the entirety of the second portion of the charge compensation region is doped with both first doping type dopants and second doping type dopants.

7. The semiconductor die of claim 6 wherein at least part of the first portion of the charge compensation region is in between the active region and the second portion of the charge compensation region.

8. The semiconductor die of claim 6 wherein:

the first portion of the charge compensation region is provided to a first depth in the drift region; and the second portion of the charge compensation region is provided to a second depth in the drift region that is greater than the first depth.

9. The semiconductor die of claim 6 wherein:

the active region comprises one or more semiconductor devices; and the edge termination region and the one or more semiconductor devices are configured to limit a change of a leakage current to less than 400

$$\frac{pA}{\text{hr} \cdot \text{cm}^2}$$

under a constant reverse bias and thermal stress at a rated voltage between 600V and 20 kV.

10. The semiconductor die of claim 9 wherein the edge termination region and the one or more semiconductor devices are configured to limit the leakage current less than 1

$$\frac{\mu A}{\text{cm}^2}$$

at the rated voltage.

11. The semiconductor die of claim 1 wherein:

the first portion of the charge compensation region has a doping concentration between $1\times10^{16}$ $\text{cm}^{-3}$ and $5\times10^{18}$ $\text{cm}^{-3}$; and the second portion of the charge compensation region has a doping concentration between $1\times10^{16}$ and $5\times10^{18}$ $\text{cm}^{-3}$.

12. The semiconductor die of claim 6 wherein the second portion of the charge compensation region has the first doping concentration of second doping type dopants and is counter-doped to have the first doping type.

13. The semiconductor die of claim 6 wherein the second of the guard rings has a doping concentration between $5\times10^{18}/\text{cm}^3$ and $1\times10^{21}/\text{cm}^3$.

14. The semiconductor die of claim 6 wherein:

the first portion of the charge compensation region is provided to a first depth in the drift region; and the second portion of the charge compensation region is provided to a second depth in the drift region that is less than the first depth.

* * * * *